United States Patent
Chun

(10) Patent No.: US 9,761,282 B2
(45) Date of Patent: Sep. 12, 2017

(54) MEMORY SYSTEM AND OPERATING METHOD THEREOF

(71) Applicant: SK hynix Inc., Gyeonggi-do (KR)

(72) Inventor: Dong Yeob Chun, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/884,411

(22) Filed: Oct. 15, 2015

(65) Prior Publication Data
US 2016/0365127 A1    Dec. 15, 2016

(30) Foreign Application Priority Data
Jun. 9, 2015 (KR) .......................... 10-2015-0081247

(51) Int. Cl.
G11C 5/14 (2006.01)
G11C 7/10 (2006.01)
G11C 7/20 (2006.01)

(52) U.S. Cl.
CPC ............ *G11C 5/148* (2013.01); *G11C 7/1093* (2013.01); *G11C 7/20* (2013.01)

(58) Field of Classification Search
CPC .......... G11C 5/148; G11C 7/1093; G11C 7/20
USPC ......................................................... 365/226
See application file for complete search history.

(56) References Cited

U.S. PATENT DOCUMENTS

| | | | |
|---|---|---|---|
| 2009/0190431 A1* | 7/2009 | Gronlund ............... | G11C 7/103 365/233.11 |
| 2011/0128977 A1* | 6/2011 | Suzuki ................ | G06F 13/4239 370/498 |
| 2014/0078530 A1* | 3/2014 | Lee ........................ | G06F 21/608 358/1.13 |
| 2014/0078850 A1* | 3/2014 | Eguchi ..................... | G11C 5/14 365/227 |

FOREIGN PATENT DOCUMENTS

| | | |
|---|---|---|
| JP | 2014-059883 | 4/2014 |
| KR | 1020090032415 | 4/2009 |

* cited by examiner

*Primary Examiner* — Anthan Tran
(74) *Attorney, Agent, or Firm* — IP & T Group LLP

(57) ABSTRACT

There are provided a memory system and an operating method thereof. A memory system includes a memory device suitable for storing data therein; and a memory controller suitable for initializing the memory device, or maintaining or changing a mode of the memory device according to power of the memory device during a wake-up operation.

19 Claims, 5 Drawing Sheets

MEMORY SYSTEM AND OPERATING METHOD THEREOF

CROSS-REFERENCE TO RELATED APPLICATION

The present application claims priority to Korean patent Application No. 10-2015-0081247, filed on Jun. 9 2015, the entire disclosure of which is herein incorporated by reference in its entirety.

BACKGROUND

1. Field

An embodiment of the present disclosure relates to a memory system and an operating method thereof, and more particularly, to a wake-up operation of a SDR/DDR combined memory system.

2. Description of the Related Art

A synchronous memory system may operate in a single data rate (SDR) mode in which one-bit data is input/output per one data input/output pin during one clock cycle, or operate in a double data rate (DDR) mode in which two-bit data is input/output per one data input/output pin during one clock cycle. The synchronous memory system of the SDR mode has excellent reliability, and the synchronous memory system of the DDR mode has fast operation speed.

Accordingly, SDR/DDR combined memory systems having advantages of the SDR mode and the DDR mode are increasingly being used.

The SDR/DDR combined memory system may operate in the SDR mode or the DDR mode. In general, a booting operation of the memory system is performed in the SDR mode to ensure the reliability of the memory system, and general operations of the memory system after completion of the booting operation are performed in the DDR mode.

Since the SDR/DDR combined memory system operates in the SDR mode or the DDR mode, the mode of the memory system is reset during a wake-up operation for re-operation after power is off.

The memory system may include a memory controller which outputs control signals in response to a command received from a host, and a memory device which performs a program, read, or erase operation in response to the control signals. Each of the memory controller and the memory device is set to the SDR mode or the DDR mode according to an operation thereof. During an operation of the SDR mode, both the memory controller and the memory device are set to the SDR mode. During an operation of the DDR mode, both the memory controller and the memory device are set to the DDR mode.

In general, during the wake-up operation, the memory controller is initialized to the SDR mode, and the memory device is also initialized to the SDR mode regardless of its previous mode before the wake-up operation. Then, the modes of the memory controller and the memory device are reset according to its previous mode before the wake-up operation. Therefore, as the time required to initialize the memory controller and the memory device increases, the total operating time of the memory system may increase.

SUMMARY

Embodiments provide a memory system with reduced time required to perform a wake-up operation, and an operating method thereof.

According to an embodiment of the present disclosure, there is provided a memory system including: a memory device suitable for storing data therein; and a memory controller suitable for initializing the memory device, or maintaining or changing a mode of the memory device according to power of the memory device during a wake-up operation.

According to an embodiment of the present disclosure, there is provided a single data rate (SDR)/double data rate (DDR) combined memory system comprising a memory device and a memory controller. The memory controller may include: a power detector suitable for determining a power status of the memory device; and a mode detector suitable for checking a status of the memory device, and determining a mode of the memory device based on the result obtained by checking the status of the memory device.

According to an embodiment of the present disclosure, there is provided a method of operating a memory system, the method including: detecting power of a memory device during a wake-up operation; initializing the memory device when the power of the memory device is in an off status; determining a mode of the memory device when the power of the memory device is not in the off status; and maintaining or changing modes of the memory device and a memory controller for controlling the memory device based on the mode of the memory device.

BRIEF DESCRIPTION OF THE DRAWINGS

Embodiments will now be described more fully hereinafter with reference to the accompanying drawings; however, the invention may be applied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity. It will be understood that when an element is referred to as being "between" two elements, it can be the only element between the two elements, or one or more intervening elements may also be present. Like reference numerals refer to like elements throughout.

DETAILED DESCRIPTION

Hereinafter, preferred embodiments of the present disclosure will be described in detail with reference to the accompanying drawings. However, the invention is not limited to the embodiments and may be implemented in different forms. These embodiments are provided only for illustrative purposes and for full understanding of the scope of the present disclosure by those skilled iii the art.

Figure 1:
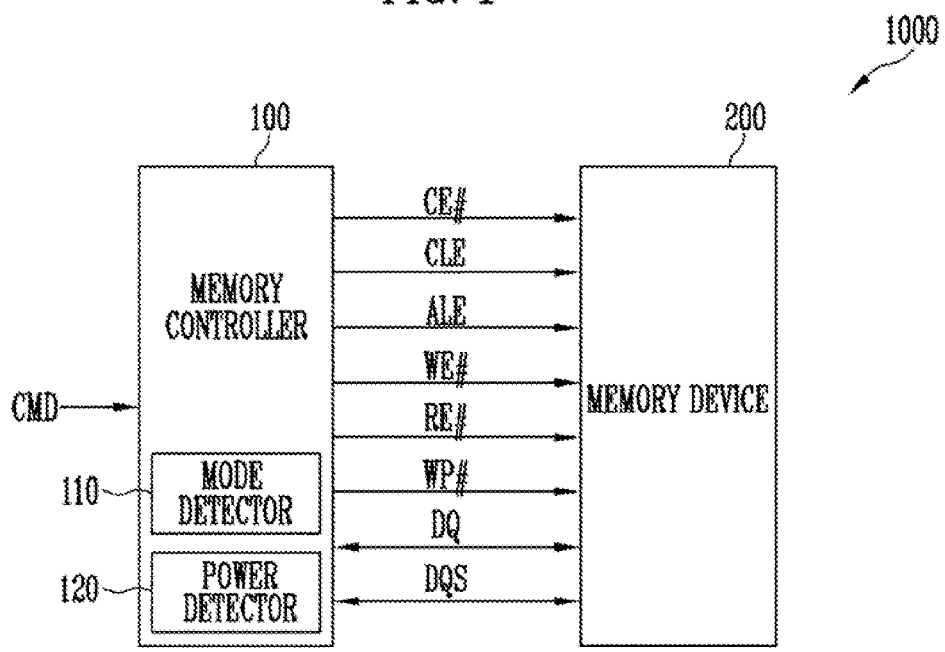
FIG. 1 is a block diagram illustrating a memory system according to an embodiment of the present disclosure.

FIG. 1 is a block diagram illustrating a memory system 1000 according to an embodiment of the present disclosure.

Referring to FIG. 1, the single data rate (SDR)/double data rate (DDR) combined memory system 1000 may include a memory device 200 configured to store data therein and a memory controller 100 configured to control the memory device 200 in response to a command CMD received from a host.

The memory controller 100 may output control signals for controlling the memory device 200 through control pins CE#, CLE, ALE, WE#, RE#, WP#, DQ, and DQS in response to the received command CMD. For example, when a wake-up command CMD is received, the memory controller 100 may initialize the memory device 200 or correct modes of the memory controller 100 and the memory device 200 according to a power status of the memory device 200.

The control pins CE#, CLE, ALE, WE#, RE#, WP#, DQ, and DQS are pins generally used in the memory controller 100. For understanding of the following embodiments, the control pins will be schematically described as follows.

A chip enable signal is applied to the CE# pin. When the memory device 200 is in a ready status, the CE# pin is used to allow a selected chip to enter into a standby mode. A command latch enable signal is applied to the CLE pin, The CLE pin is used when a command is loaded into the memory device 200. For example, when a high command latch enable signal is applied to the CLE pin during the wake-up operation, the memory controller 100 may load a status check command into the memory device 200.

An address latch enable signal is applied to the ALE pin. The ALE pin is used to control an address to be loaded into the memory device 200. For example, when a high address latch enable signal is applied to the ALE pin, an address may be loaded into the memory device 200.

A write enable signal is applied to the WE# pin. The WE# pin is used to input data or commands.

A read enable signal is applied to the RE# pin. The RE# pin is used to output data.

A write protect signal is applied to the WP# pin. When an unexpected program operation or erase operation is performed, the WP# pin is used to protect the memory device.

The DQ pin is used to transmit data or commands.

The DQS pin is used to transmit a data strobe signal during a high-speed operation. For example, when the memory device is in the DDR mode, the data strobe signal is toggled through the DQS pin.

The memory controller 100 including the above-described control pins CE#, CLE, ALE, WE#, RE#, WP#, DQ, and DQS may include a mode detector 110 and a power detector 120 to perform the wake-up operation.

The mode detector 110 may determine a current mode of the memory device 200 according to data received from the memory device 200 (i.e., data transmitted through the DQ pin) and a data strobe signal (i.e., a signal transmitted through the DQS pin), and output a determination result as an internal signal within the memory controller 100. The memory controller 100 may control the memory device 200 to maintain or change the current mode thereof according to the internal signal output from the mode detector 110. Also, the memory controller 100 may maintain or change the current mode thereof through internal information thereof.

During the wake-up operation the power detector 120 may detect power supplied to the memory device 200, and determine whether the power of the memory device 200 is in an off status.

That is, during the wake-up operation, the power detector 120 may detect the power of the memory device 200. When it is determined by the power detector 120 that the power of the memory device 200 is not in the off status, the mode detector 110 may determine the mode of the memory device 200 between the SDR and DDR modes.

When the power of the memory system 1000 is off, the power of the memory device 200 may be in an on status or in the off status according to a setting status thereof. For example, when the power of the memory device 200 is set to the on status, the power of the memory device 200 may automatically go to the on status during the wake-up operation performed after the power-off of the memory system 1000. Alternatively, when the power of the memory device 200 is set to the off status, the power of the memory device 200 may automatically go to the off status during the wake-up operation performed after the power-off of the memory system 1000. When unstable power is supplied to the memory device 200 during the wake-up operation even though the power of the memory device 200 is set to the on or off status, the power detector 120 determines that the power of the memory 200 is in the on status.

The wake-up operation of the memory system will be described in detail as follows.

Figure 2:
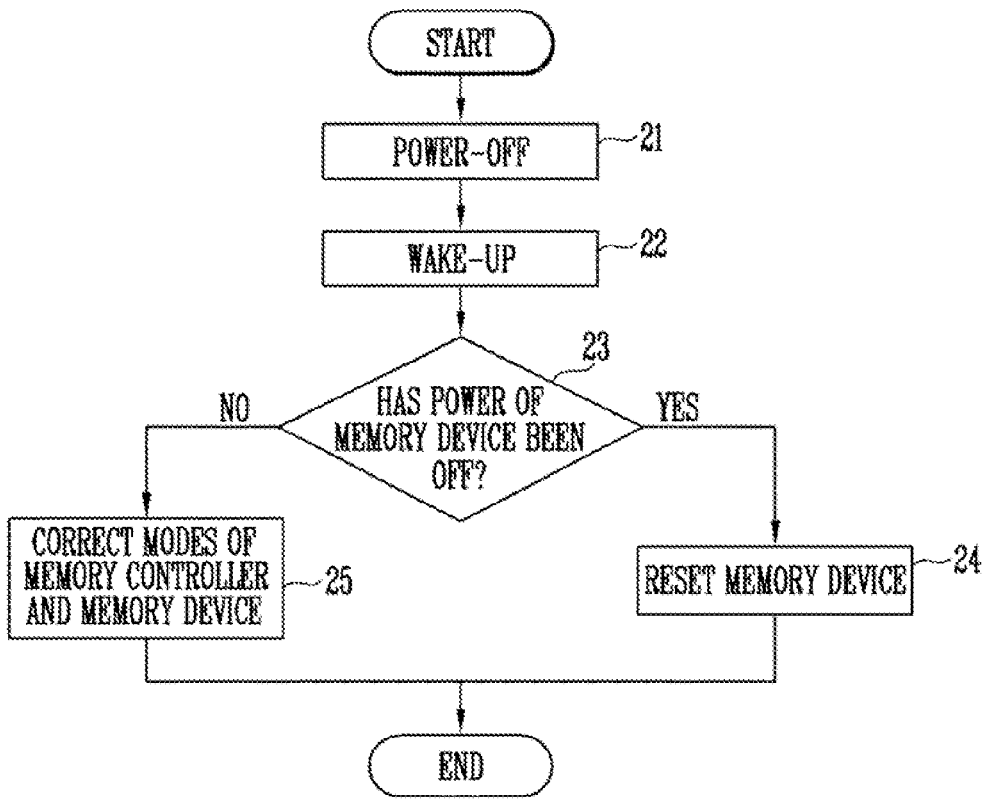
FIG. 2 is a flowchart illustrating a wake-up operation according to an embodiment of the present disclosure.

FIG. 2 is a flowchart illustrating the wake-up operation according to an embodiment of the present disclosure.

Referring to FIG. 2, when the power of the memory system 1000 is off at step 21 and a wake-up command is then received to the memory controller 100 at step 22, the memory controller 100 may determine a power status of the memory device 200 at step 23 a id is initialized to the SDR mode at step 24 or correct modes of the memory controller 100 and the memory device 200 at step 25 according to the power status of the memory device 200 determined at step 23. That is, unlike the conventional memory controller that is reset to the SDR mode in response to a wake-up command, the memory controller 100 may correct the modes of the memory controller 100 and the memory device 200 according to the mode of the memory device 200.

Steps 23 to 25 will be described in detail as follows.

At step 23, the memory controller 100 may detect the power of the memory device 200 and determine whether the power of the memory device 200 is in the off status. When the power of the memory device 200 is determined to be in the off status ("Yes" of step 23), the memory controller 100 may perform initialization by resetting the memory device 200. When the power of the memory device 200 is determined not to be in the off status ("No" of step 23), this means that the power of the memory device 200 is in the on status or that it cannot be determined whether the power of the memory device 200 is in the on status or in the off status. In this case, the memory controller 100 outputs control signals to the memory device 200, and maintains or changes the modes of the memory controller 100 and the memory device 200 based on data or data strobe signal output from the memory device 200 through DQ and DQS pins in response to the control signals.

At step 23, the power detector 120 of the memory controller 100 may determine the power status of the memory device 200. The memory system 1000 including the power detector 120 will be described in detail as follows.

Figure 3:
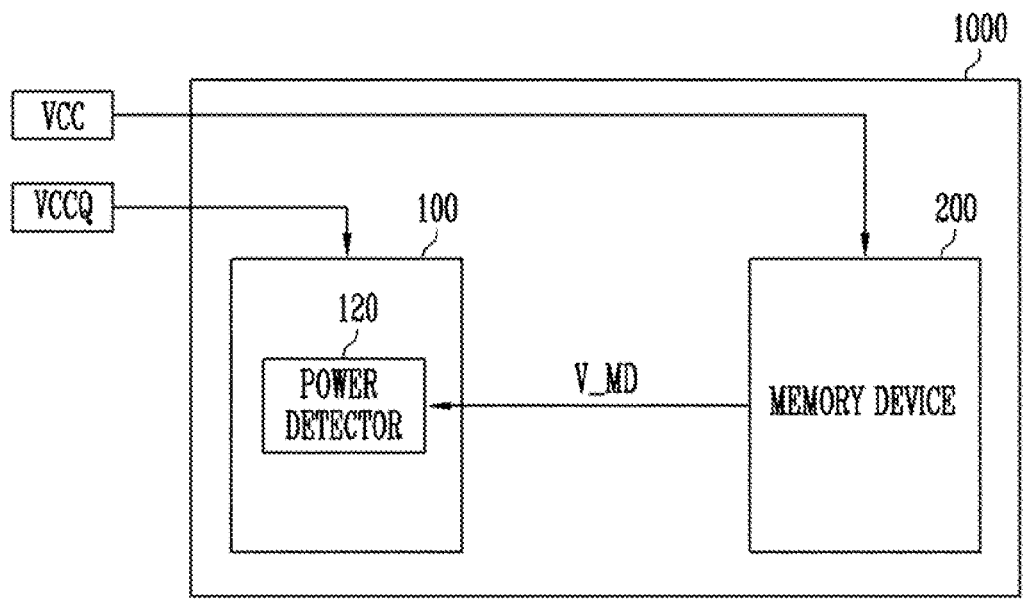
FIG. 3 is a diagram illustrating a power system of the memory system.

FIG. 3 is a diagram illustrating a power system of he memory system 1000.

Referring to FIG. 3, the memory system 100 may include the memory controller 100 and the memory device 200. The power detector 120 may be included inside or outside the memory controller 100. FIG. 3 exemplarily shows the power detector 120 included inside the memory controller 100.

The memory controller 100 may receive first and second voltages VCCQ and VCC supplied from the outside of the memory system 1000. Both the first and second voltages VCCQ and VCC may be positive voltages, and the first voltage VCCQ may be lower than the second voltage VCC. For example, the first voltage VCCQ may be 1.8V, and the second voltage VCC may be 3.3V.

A third voltage V_MD may be routed to the memory controller 100 from the memory device 200. When the power of the memory device 200 is normal, the third voltage V_MD may have the same level as the second voltage VCC.

Thus, during the wake-up operation of the memory system 1000, the power detector 120 may receive the third voltage V_MD transmitted from the memory device 200, and determine whether the power of the memory device 200 is in the off status according to the level of the third voltage V_MD.

The method in which the power detector 120 determines the power status of the memory device 200 will be described in detail as follows.

Figure 4:
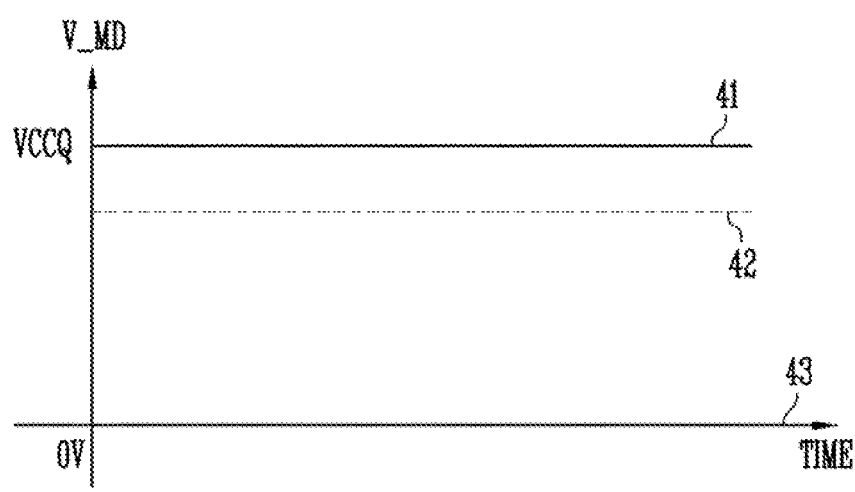
FIG. 4 is a graph illustrating a power stat s of a memory device during a wake-up operation.

FIG. 4 is a graph illustrating a power status of the memory device in the wake-up operation.

Referring to FIGS. 3 and 4, when the third voltage V_MD transmitted from the memory device 200 is 0V ("43" of FIG. 4), the power detector 120 may determine that the power of the memory device 200 is in the off status. In this case of 0V of the third voltage V_MD, the memory controller 100 and the memory device 200 may be initialized to the SDR mode at step 24.

When the third voltage V_MD is equal to the second voltage VCCQ ("41" of FIG. 4), the power detector 120 may determine that the power of the memory device 200 is in the on status. When the third voltage V_MD has a level between 0V and the second voltage VCCQ ("42" of FIG. 4), the power detector 120 may determine that the power of the memory device 200 is not in the off status. That is, when it is determined by the power detector 120 that the power of the memory device 200 is not in the off status ("41" or "42" of FIG. 4), the memory controller 100 performs step 25 for correcting the modes of the memory controller 100 and the memory device 200.

During the wake-up operation of the power of the SDR/DDR combined memory system 1000 is off, the modes of the memory controller 100 and the memory device 200 may be changed. Step 25 for correcting the mode of the memory controller 100 and the memory device 200 will be described in detail as follows.

FIGS. 5 to 8 are timing diagrams illustrating step 25 for correcting the modes of the memory controller 100 and the memory device 200 method according to an embodiment of the present disclosure. FIGS. 5 to 8 exemplarily show determination of the mode of the memory device 200 at step 25 by assuming that the data strobe signal is not toggled when the memory device 200 is in the SDR mode and is toggled when the memory device 200 is in the DDR mode.

When the memory controller 100 and the memory device 200 are in different modes between the SDR and DDR modes, one of the 2 different modes may be changed to the other one to synchronize the memory controller 100 and the memory device 200. According to an embodiment of the present disclosure, the SDR mode may be changed to the DDR mode. When both the memory controller 100 and the memory device 200 are in one of the SDR and DDR modes, the memory controller 100 and the memory device 200 are already synchronized with each other, and thus the mode of the memory controller 100 and the memory device 200 may be maintained.

Figure 5:
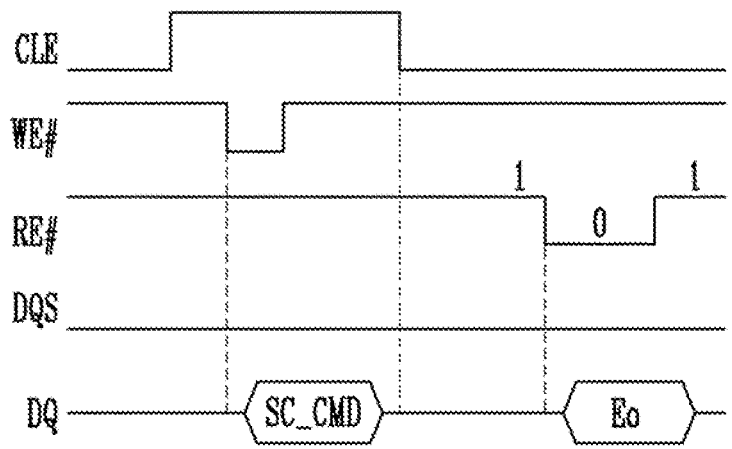
FIGS. 5 to 8 are timing diagrams illustrating a step for correcting modes of a memory controller and a memory device according to an embodiment of the present disclosure.

FIG. 5 shows example case 1 where both the memory controller 100 and the memory device 200 are in the SDR mode. During the wake-up operation, the memory controller 100 may identify its own mode through the internal information, but does not identify the mode of the memory device 200 because there is no information on the mode of the memory device 200. That is, during the wake-up operation after the power-off of the memory system, the mode of the memory device 200 may be changed, and hence the memory controller 100 cannot identify the mode of the memory device 200 until the memory controller 100 receives information from the memory device 200.

The memory controller 100 may identify the mode of the memory device 200 by using the following method.

The memory controller 100 may prepare to transmit a command by transmitting the command latch enable signal of '1' through the CLE pin. When the write enable signal toggles from '1' to '0' through the WE# pin, the status check command SC_CMD may be loaded into the memory device 200 through the DQ pin.

While the status check command SC_CMD is loaded into the memory device 200, the read enable signal may be maintained in a status of '1' through the RE#. When the status check command SC_CMD is loaded into the memory device 200, the memory controller 100 may toggle the read enable signal from '1' to '0' through the RE# pin, and again toggle the read enable signal from '0' to '1' after a certain time. When the read enable signal toggles from '1' to '0,' the memory device 200 may transmit echo data Eo to the memory controller 100 through the DQ pin. For example, the echo data Eo may represent acknowledgement that the status check command SC_CMD has been received. The memory controller 100 may detect the echo data Eo only when the modes of the memory controller 100 and the memory device 200 are identical. When the modes of the memory controller 100 and the memory device 200 are different, the memory controller 100 may not detect the echo data Eo.

In the example case 1, the memory controller 100 and the memory device 200 are set to the same mode, and hence the memory controller 100 may detect the echo data Eo output from the memory device 200. Also, in the example case 1, the memory device 200 is set to the SDR mode as a low-speed operation mode, and hence the data strobe signal of the DQS pin may not toggle.

Since the data strobe signal of the DQS pin does not toggle, the memory controller 100 may determine that the memory device 200 is in the SDR mode. Since the echo data Eo is detected by the memory controller 100, the memory controller 100 may determine that the modes of the memory device 200 and the memory controller 100 are identical. Accordingly, the memory controller 100 may detect that both the memory controller 100 and the memory device 200 are in the SDR mode. In the example case 1, it is identified that, both the memory controller 100 and the memory device 200 are in the SDR mode or they are synchronized with each other, and hence the wake-up operation may be ended without performing an additional operation for synchronizing the memory controller 100 and the memory device 200.

Figure 6:
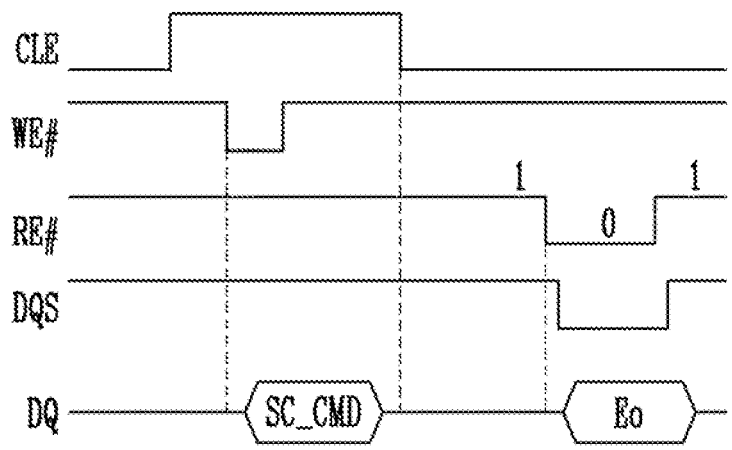

FIG. 6 shows example case 2 where the memory controller 100 is in the SDR mode and the memory device 200 is in the DDR mode. In the example case 2, the memory controller 100 may not identify the mode of the memory device 200 until the memory controller 100 receives information from the memory device 200.

The memory controller 100 may identify the mode of the memory device 200 by using the following method.

The memory controller 100 may prepare to transmit a command by transmitting the command latch enable signal of '1' through the CLE When the write enable signal toggles from '1' to '0' through the WE# pin, the status check command SC_CMD may be loaded into the memory device 200 through the DQ pin.

While the status check command SC_CMD is loaded into the memory device 200, the read enable signal may be maintained in a status of '1' through the RE#. When the status check command SC_CMD is loaded into the memory device 200, the memory controller 100 may toggle the read enable signal from '1' to '0' through the RE# pin, and again toggle the read enable signal from '0' to '1' after a certain time. When the read enable signal toggles from '1' to '0,' the memory device 200 may transmit echo data Eo to the memory controller 100 through the DQ pin. For example, the echo data Eo may represent acknowledgement that the status check command SC_CMD has been received. The memory controller 100 may detect the echo data Eo only when the modes of the memory controller 100 and the memory device 200 are identical. When the modes of the memory controller 100 and the memory device 200 are different, the memory controller 100 may not detect the echo data Eo.

In the example case 2, the memory controller 100 and the memory device 200 are set to different modes, and hence the memory controller 100 may not detect the echo data Eo output from the memory device 200, Also, in the example case 2, the memory device 200 is set to the DDR mode as a high-speed operation mode, and hence the data strobe signal of the DQS pin may toggle.

Since the data strobe signal of the DQS pin toggles, the memory controller 100 may determine that the memory device 200 is in the DDR mode. Since the echo data Eo is not detected by the memory controller 100, the memory controller 100 may determine that the memory device 200 and the memory controller 100 are in different modes. Accordingly, the memory controller 100 may detect that the memory device 200 is in the DDR mode and the memory controller 100 is in the SDR mode.

In the example case 2, the memory controller 100 is set to the SDR mode and the memory device 200 is set to the DDR mode. Hence, the memory controller 100 may change its own mode to the DDR mode such that the memory controller 100 is synchronized with the memory device 200. That is, when one of the memory controller 100 and the memory device 200 is set to the SDR mode and the other of the memory controller 100 and the memory device 200 is set to the DDR mode, the SDR mode of the device may be changed to the DDR mode. When the memory controller 100 and the memory device 200 are synchronized, the wake-up operation is ended.

Figure 7:
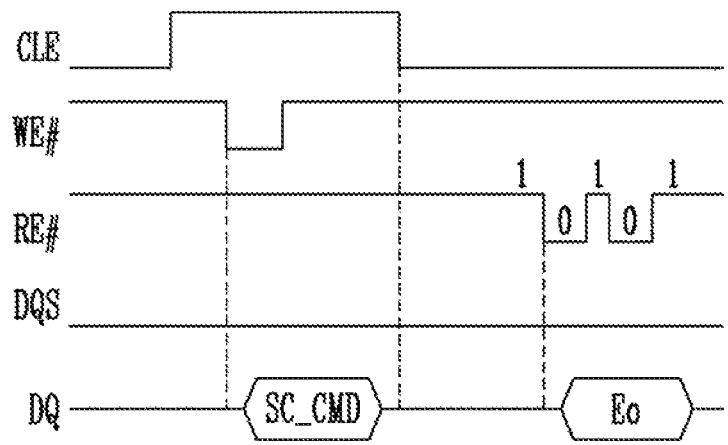

FIG. 7 shows example case 2 where the memory controller 100 is in the DDR mode and the memory device 200 is in the SDR mode. In the example case 3, the memory controller 100 may not identify the mode of the memory device 200 until the memory controller 100 receives information from the memory device 200.

The memory controller 100 may identify the mode of the memory device 200 by using the following method.

The memory controller 100 may prepare to transmit a command by transmitting the command latch enable signal of '1' through the CLE pin. When the write enable signal toggles from '1' to '0' through the WE# pin, the status check command SC_CMD may be loaded into the memory device 200 through the DQ pin.

While the status check command SC_CMD is loaded into the memory device 200, the read enable signal may be maintained in a status of '1' through the RE#. When the status check command SC_CMD is loaded into the memory device 200, the memory controller 100 may toggle the read enable signal four times between '1' and '0' through the RE# pin according to the DDR mode, which is different from the SDR mode in which the memory controller 100 toggles the read enable signal twice between '1' and '0' as described with reference to FIGS. 5 and 6.

When the read enable signal first toggles from '1' to '0,' the memory device 200 may transmit echo data Eo to the memory controller 100 through the DQ pin, For example, the echo data Eo may represent acknowledgement that the status check command SC_CMD has been received. The memory controller 100 may detect the echo data Eo only when the modes of the memory controller 100 and the memory device 200 are identical. When the modes of the memory controller 100 and the memory device 200 are different, the memory controller 100 may not detect the echo data Eo.

In the example case 3, the memory controller 100 and the memory device 200 are set to different modes, and hence the memory controller 100 may not detect the echo data Eo output from the memory device 200. Also, in the example case 3, the memory device 200 is set to the SDR mode as a low-speed operation mode, and hence the data strobe signal of the DQS pin may not toggle, Since the data strobe signal of the DQS pin does not toggle, the memory controller 100 may determine that the memory device 200 is in the SDR mode. Since the echo data Eo is not detected by the memory controller 100, the memory controller 100 may determine that the memory device 200 and the memory controller 100 are in different modes. Accordingly, the memory controller 100 may detect that the memory device 200 is in the SDR mode and the memory controller 100 is in the DDR mode.

In the example case 3, the memory controller 100 is set to the DDR mode and the memory device 200 is set to the SDR mode. Hence, the memory controller 100 may change the mode of the memory device 200 to the DDR mode such that the memory controller 100 and the memory device 200 are synchronized. That is, when one of the memory controller 100 and the memory device 200 is set to the SDR mode and the other of the memory controller 100 and the memory device 200 is set to the DDR mode, the SDR mode of the device may be changed to the DDR mode. When the memory controller 100 and the memory device 200 are synchronized, the wake-up operation is ended.

Figure 8:
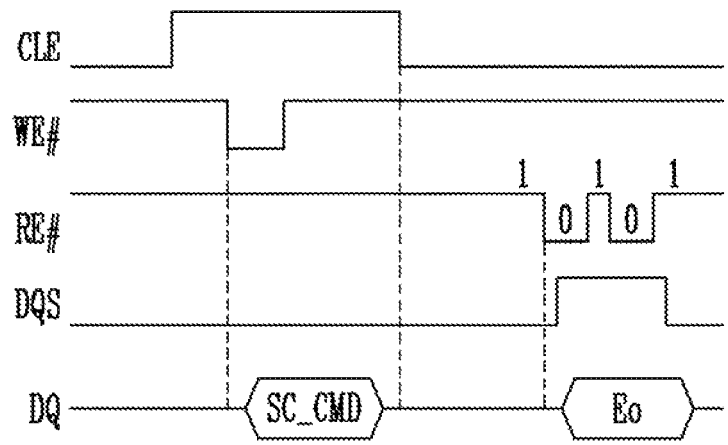

FIG. 8 shows example case 4 where both the memory controller 100 and the memory device 200 are in the DDR mode. In the example case 4, the memory controller 100 cannot identify the mode of the memory device 200 until the memory controller 100 receives information From the memory device 200.

The memory controller 100 may identify the mode of the memory device 200 by using the following method.

The memory controller 100 may prepare to transmit a command by transmitting the command latch enable signal of '1' through the CLE pin. When the write enable signal toggles from '1' to '0' through the WE# pin, the status check command SC_CMD may be loaded into the memory device 200 through the DQ pin.

While the status check command SC_CMD is loaded into the memory device 200, the read enable signal may be maintained in a status of '1' through the RE#. When the status check command SC_CMD is loaded into the memory device 200, the memory controller 100 may toggle the read enable signal four times between '1' and '0' through the RE# pin according to the DDR mode, which is different from the SDR mode in which the memory controller 100 toggles the read enable signal twice between '1' and '0' as described with reference to FIGS. 5 and 6.

When the read enable signal first toggles from to '1' to '0,' the memory device 200 may transmit echo data Eo to the memory controller 100 through the DQ pin. For example, the echo data Eo may represent acknowledgement that the status check command SC_CMD has been received. The memory controller 100 may detect the echo data Eo only when the modes of the memory controller 100 and the memory device 200 are identical. When the modes of the memory controller 100 and the memory device 200 are different, the memory controller 100 may not detect the echo data Eo.

In the example case 4, the memory controller 100 and the memory device 200 are set to the same mode, and hence the memory controller 100 may detect the echo data Eo output from the memory device 200. Also, in the example case 4, the memory device 200 is set to the DDR mode as a high-speed operation mode, and hence the data strobe signal of the DQS pin may toggle.

Since the data strobe signal of the DQS pin toggles, the memory controller 100 may determine that the memory device 200 is in the DDR mode. Since the echo data Eo is detected by the memory controller 100, the memory controller 100 may determine that the modes of the memory device 200 and the memory controller 100 are identical. Accordingly, the memory controller 100 may detect that both the memory controller 100 and the memory device 200 are in the DDR mode. In the example case 4, it is identified that both the memory controller 100 and the memory device 200 are in the DDR mode or they are synchronized, and hence the wake-up operation may be ended without performing an additional operation for synchronizing the memory controller 100 and the memory device 200.

As described above, when the power of the memory device 200 is not in the off status in the wake-up operation, the memory controller 100 does not reset the memory device 200 but synchronizes the memory controller 100 and the memory device 200 by determining whether the memory device 200 is in the SDR mode or in the DDR mode. Thus, it is possible to reduce the time required to perform the wake-up operation.

Figure 9:
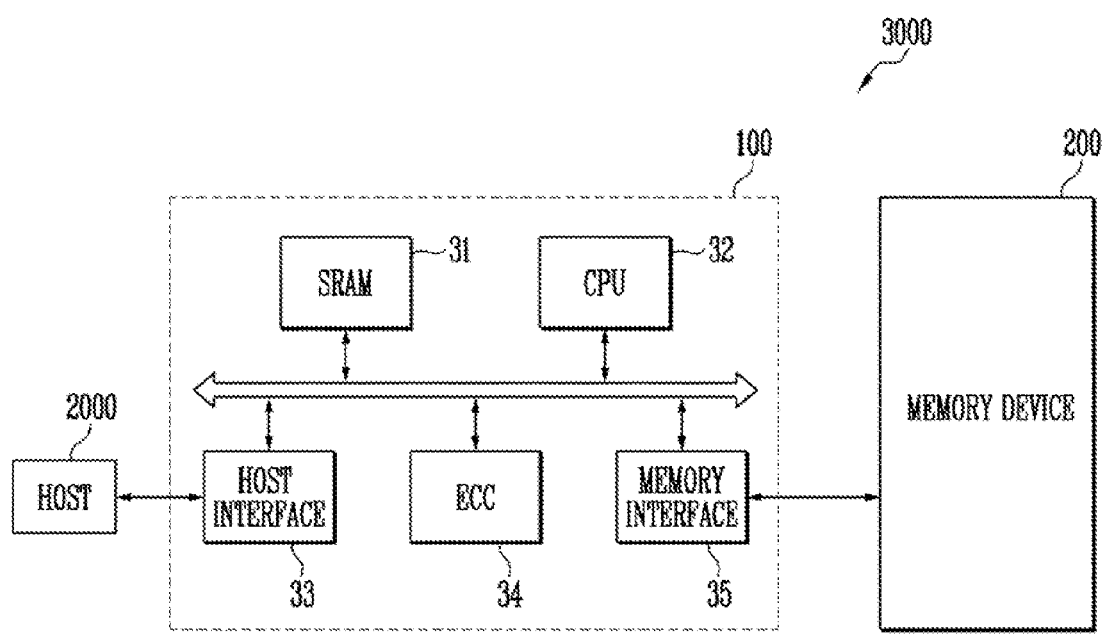
FIG. 9 is a block diagram illustrating a memory system according to another embodiment of the present disclosure.

FIG. 9 is a block diagram illustrating a memory system according to another embodiment of the present disclosure.

Referring to FIG. 9, the memory system 3000 according to the embodiment of the present disclosure may include a memory controller 100 and a memory device 200.

The memory controller 100 may be configured to control the memory device 200. For example, the memory controller 100 may include an SRAM 31, a CPU 32, a host interface 33, an ECC 34, and a memory interface 35 in addition to the mode detector 110 and the power detector 120, which are described in FIG. 1.

The SRAM 31 may be used as a working memory of the CPU 32. The host interface (host I/F) 33 may be provided with a data exchange protocol of a host 2000 coupled to the memory system 3000. The ECC 34 provided in the memory controller 100 may detect and correct errors included in data read out from the memory device 200, The memory interface (memory I/F) 35 may interface with the memory device 200. The CPU 32 may perform a control operation for data exchange of the memory controller 100. Although not shown in FIG. 9, the memory system 3000 may further include a ROM (not shown) for storing code data for interfacing with the host.

The memory system 3000 may be applied to a computer, an ultra mobile PC (UMPC), a workstation, a net-book, a personal digital assistant (PDA), a portable computer, a web tablet, a wireless phone, a mobile phone, a smart phone, a digital camera, a digital audio recorder, a digital audio player, a digital video recorder, a digital video player, a device capable of transmitting/receiving information in a wireless environment, and one of various electronic devices that constitute a home network.

Figure 10:
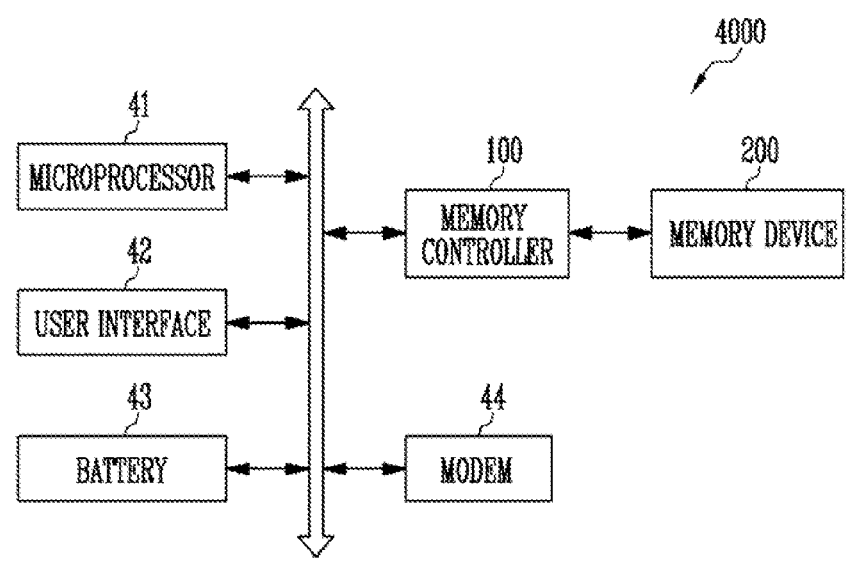
FIG. 10 is a diagram illustrating a schematic configuration of a computing system including a memory system according to an embodiment of the present disclosure.

FIG. 10 is a diagram illustrating a schematic configuration of a computing system including a memory system according to an embodiment of the present disclosure.

Referring to FIG. 10, the computing system 4000 includes a memory device 200, a memory controller 100, a modem 44, a microprocessor 41, and a user interface 42, which are electrically coupled to a bus. When the computing system 4000 is a mobile device, a battery 43 for supplying operation voltages of the computing system 4000 may be additionally provided in the computing system 4000. Although not shown in this figure, the computing system 4000 may further include an application chip set, a camera image processor (CIS), a mobile DRAM, and the like.

The memory device and the memory controller according to the present disclosure may be packaged in various forms. For example, the memory device and the memory controller may be packaged in a manner such as package on package (PoP), ball grid arrays (BGAs), chip scale packages (CSPs), plastic leaded chip carrier (PLCC), plastic dual in-line package (PDIP), die in Waffle pack, die in wafer form, chip on board (COB), ceramic dual in-line package (CERDIP), plastic metric quad flat pack (MQFP), thin quad flat pack (TQFP), small outline integrated circuit (SOIC), shrink small out line package (SSOP), thin small outline package (TSOP), thin quad flat pack (TQFP) system in package (SIP), multi chip package (MCP), wafer-level fabricated package (WFP), or wafer-level processed stack package (WSP).

According to the present disclosure, in the wake-up operation of the memory system, the modes of the memory controller and the memory device are quickly corrected to the SDR mode or the DDR mode, thereby reducing the time required to perform the wake-up operation.

Embodiments have been disclosed herein, and although specific terms are employed, they are used and are to be interpreted in a generic and descriptive sense only and not for the purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A memory system comprising:
   a memory device suitable for storing data; and
   a memory controller suitable for initializing the memory device, or maintaining or changing a mode of the memory device according to power of the memory device during a wake-up operation, wherein, when the power of the memory device is in an off status, the memory controller and the memory device are initialized to a single data rate (SDR) mode.

2. The memory system of claim 1, wherein the memory system is the single data rate (SDR) or a double data rate (DDR) combined memory system.

3. The memory system of claim 1, wherein the memory controller maintains and changes modes of the memory controller and the memory device when the power of the memory device is not in the off status.

4. The memory system of claim 3, wherein the memory controller determines that the power of the memory device is not in the off status when the power of the memory device has a set voltage or a voltage between the set voltage and 0V.

5. The memory system of claim 3, wherein, when the power of the memory device is not in the off status, the memory controller transmits a status check command to the memory device, and maintains or changes the modes of the memory controller and the memory device according to echo data and a data strobe signal output from the memory device in response to the status check command.

6. The memory system of claim 5, wherein, when detecting the echo data, the memory controller determines that the modes of the memory controller and the memory device are identical, and determines the mode of the memory device according to the data strobe signal.

7. The memory system of claim 6,
wherein, when the data strobe signal is not toggled and the memory controller detects the echo data, the memory controller determines that the memory device and the memory controller are in the SDR mode,
wherein, when the data strobe signal is toggled and the memory controller does not detect the echo data, the memory controller determines that the memory device is in a DDR mode and the memory controller is in the SDR mode,
wherein, when the data strobe signal is not toggled and the memory controller does not detect the echo data, the memory controller determines that the memory device is in the SDR mode and the memory controller is in the DDR mode, and
wherein, when the data strobe signal is toggled and the memory controller detects the echo data, the memory controller determines that the memory device and the memory controller are in the DDR mode.

8. A single data rate (SDR)/double data rate (DDR) combined memory system comprising a memory device and a memory controller,
wherein the memory controller includes:
a power detector suitable for determining a power status of the memory device; and
a mode detector suitable for checking a status of the memory device, and determine a mode of the memory device based on the result obtained by checking the status of the memory device,
wherein, when the power of the memory device is in the off status, the memory controller initializes the memory controller and the memory device to the SDR mode.

9. The memory system of claim 8, wherein the power detector determines whether power of the memory device is in an off status by detecting the power of the memory device.

10. The memory system of claim 9,
wherein, when the power of the memory device is not in the off status, the memory controller transmits a status check command to the memory device to determine modes of the memory controller and the memory device.

11. The memory system of claim 10, wherein the mode detector determines the modes of the memory controller and the memory device according to echo data and a data strobe signal output from the memory device in response to the status check command.

12. The memory system of claim 11, wherein, when detecting the echo data, the mode detector determines that the modes of the memory controller and the memory device are identical, and determines the mode of the memory device according to the data strobe signal.

13. The memory system of claim 8, wherein, when it is determined that the memory controller and the memory device are set to the same mode and the memory device is set to the SDR mode based on the result obtained by checking the status of the memory device, the memory controller maintains the modes of the memory controller and the memory device as the SDR mode.

14. The memory system of claim 8, wherein, when it is determined that the memory controller and the memory device are set to different modes and the memory device is set to the DDR mode based on the result obtained by checking the status of the memory device, the memory controller changes the mode of the memory controller to the DDR mode, and maintains the mode of the memory device.

15. The memory system of claim 8, wherein, when it is determined that the memory controller and the memory device are set to different modes and the memory device is set to the SDR mode based on the result obtained by checking the status of the memory device, the memory controller maintains the mode of the memory controller, and maintains the mode of the memory device as the DDR mode.

16. The memory system of claim 8, wherein, when it is determined that the memory controller and the memory device are set to the same mode and the memory device is set to the DDR mode based on the result obtained by checking the status of the memory device, the memory controller maintains the modes of the memory controller and the memory device as the DDR mode.

17. A method of operating a memory system, the method comprising:
detecting power of a memory device during a wake-up operation;
initializing the memory device to a single data rate (SDR) mode when the power of the memory device is in an off status;
determining a mode of the memory device when the power of the memory device is not in the off status; and
maintaining or changing modes of the memory device and a memory controller for controlling the memory device based on the mode of the memory device.

18. The method of claim 17, wherein the determining of the mode of the memory device includes:
transmitting a status check command to the memory device; and
determining the modes of the memory controller and the memory device according to echo data and a data strobe signal output from the memory device in response to the status check command.

19. The method of claim 18,
wherein, when the data strobe signal is not toggled and the memory controller detects the echo data, the memory controller determines that the memory device and the memory controller are in the single data rate (SDR) mode, wherein, when the data strobe signal is toggled and the memory controller does not detect the echo data, the memory controller determines that the memory device is in a double data rate (DDR) mode and the memory controller is in the SDR mode, wherein, when the data strobe signal is not toggled and the memory controller does not detect the echo data, the memory controller determines that the memory device is in the SDR mode and the memory controller is in the DDR mode, and wherein, when the data strobe signal is toggled, and the memory controller detects the echo data, the memory controller determines that the memory device and the memory controller are in the DDR mode.

* * * * *